(12) United States Patent
Yoshida

(10) Patent No.: US 6,423,377 B2
(45) Date of Patent: Jul. 23, 2002

(54) METHOD FOR PRODUCING ORGANIC INSULATING FILM

(75) Inventor: Yuji Yoshida, Tokyo (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/793,095

(22) Filed: Feb. 27, 2001

(30) Foreign Application Priority Data

Mar. 1, 2000 (JP) .......................................... 2000-055431

(51) Int. Cl.$^7$ ................................................ B05D 3/07
(52) U.S. Cl. ................................ 427/385.5; 427/388.1; 427/389.1
(58) Field of Search ........................... 427/385.5, 388.1, 427/388.4, 388.5, 389.7, 420, 421, 428, 429, 430.1; 428/411.14; 252/62.3; 524/375, 910; 523/307

(56) References Cited

U.S. PATENT DOCUMENTS 3,568,012 A * 3/1971 Ernst et al. .................. 257/729
4,965,134 A * 10/1990 Ahne et al. .................. 427/240

* cited by examiner

*Primary Examiner*—Shrive P. Beck
*Assistant Examiner*—Rebecca A. Blanton
(74) *Attorney, Agent, or Firm*—Birch, Stewart, Kolasch & Birch, LLP

(57) ABSTRACT

A method for producing an organic insulating film comprising the steps of
coating a solution containing a dissolved organic resin having a structure of the following formula (1) on a substrate, and
exposing the coated substrate at a temperature of 200° C. or more under an atmosphere of an oxygen partial pressure of 0.01 atm or less, (1)

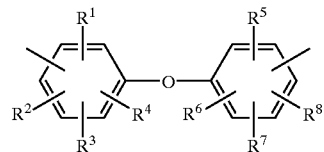

wherein each of $R^1$ to $R^8$ is independently selected from the group consisting of a hydrogen atom, fluorine atom, chlorine atom, bromine atom and iodine atom, alkyl groups having 1 to 10 carbon atoms, functional groups containing a double bond having 2 to 10 carbon atoms, functional groups containing a triple bond having 2 to 10 carbon atoms, a methoxy group, ethoxy group and propoxy group.

7 Claims, No Drawings

METHOD FOR PRODUCING ORGANIC INSULATING FILM

BACKGROUND OF THE INVENTION

1. Field of the Invention

The present invention relates to a method for producing an organic insulating film used for insulation and coating in electronic devices such as IC, LSI and the like.

2. Description of Related Art

Recently, the shrinking design rule of IC, LSI and the like has led to increased interconnection delay caused by parasitic capacity in an insulation film. For solving interconnection delay, it is desired that an insulation film has lower dielectric constant. Consequently, notice is taken of an organic insulating film using an organic resin having lower dielectric constant in place of a conventionally used CVD film or a silica-based film such as a spin on glass (SOG) film and the like. For the organic insulating film, thermosetting resins which can form a network polymer structure by curing are used for the purpose of suppressing thermal distortion. Particularly, organic resins having an unsaturated group in the resin chain are regarded since the resulting organic insulating film has lower water absorption. However, in the above-mentioned organic insulating film, it has been difficult to date to obtain reproducibility of its electric property as compared with an SOG film. Further, in the organic insulation film, uniformity has sometimes occurred in film quality and film thickness after baking.

An object of the present invention is to provide a method for producing an organic insulating film having low dielectric constant stably on a substrate.

The present inventors have intensively studied and resultantly found that the above-mentioned object can be attained by producing an organic insulating film on a substrate under specific oxygen atmosphere and temperature condition, and have completed the present invention.

SUMMARY OF THE INVENTION

Namely, the present invention relates to a method for producing an organic insulating film comprising the steps of
  coating a solution containing a dissolved organic resin having a structure of the following formula (1) on a substrate, and
  exposing said coated substrate at a temperature of 200° C. or more under an atmosphere of an oxygen partial pressure of 0.01 atm or less,

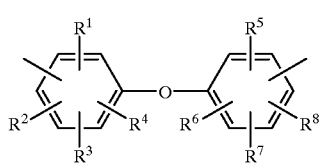

(1)

wherein, each of $R^1$ to $R^8$ is independently selected from the group consisting of a hydrogen atom, fluorine atom, chlorine atom, bromine atom and iodine atom, alkyl groups having 1 to 10 carbon atoms, functional groups containing a double bond having 2 to 10 carbon atoms, functional groups containing a triple bond having 2 to 10 carbon atoms, a methoxy group, ethoxy group and propoxy group.

DETAILED DESCRIPTION OF THE INVENTION

The present invention relates to a method for producing an organic insulating film comprising coating a solution containing a dissolved organic resin having a structure of the formula (1) on a substrate, then, exposing the above-mentioned substrate at a temperature of 200° C. or more under an atmosphere of an oxygen partial pressure of 0.01 atm or less, preferably an oxygen partial pressure of 0.001 or less:

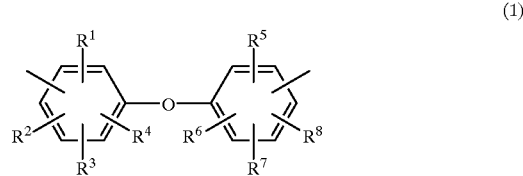

(1)

wherein each of $R^1$ to $R^8$ is independently selected from the group consisting of a hydrogen atom, fluorine atom, chlorine atom, bromine atom and iodine atom, alkyl groups having 1 to 10 carbon atoms, functional groups containing a double bond having 2 to 10 carbon atoms, functional groups containing a triple bond having 2 to 10 carbon atoms, and a methoxy group, ethoxy group and propoxy group.

Further, it is preferable that at least one of $R^1$ to $R^8$ in the formula (1) is a functional group containing a double bond having 2 to 10 carbon atoms or a functional group containing a triple bond having 2 to 10 carbon atoms, since, in this case, the resulting organic insulating film gets lower dielectric constant. Examples of these functional groups include unsaturated hydrocarbon groups such as a vinyl group, allyl group, isopropenyl group, butenyl group, cyclohexenyl group, cyclooctenyl group, butadienyl group, cyclopentadienyl group, ethynyl group, propinyl group and the like. Further, a vinyldimethylsilyl group, vinyldiethylsilyl group, divinylmethylsilyl group, vinyloxy group, allyloxy group, vinylamino group, allylamino group and the like are listed.

The organic resin in the present invention is not particularly restricted providing a skeleton of the formula (1) is included in the polymer chain of the resin, and particularly, it is preferable that the polymer chain has a structure of the following formula (2),

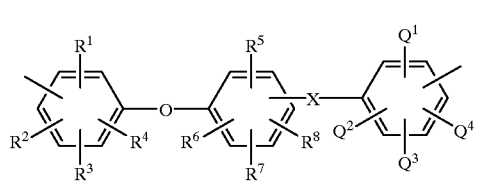

(2)

wherein, $R^1$ to $R^8$ are as defined in the formula (1). Each of $Q^1$ to $Q^4$ is independently selected from the group consisting of a hydrogen atom, fluorine atom, chlorine atom, bromine atom and iodine atom, alkyl groups having 1 to 10 carbon atoms, functional groups containing a double bond having 2 to 10 carbon atoms, functional groups containing a triple bond having 2 to 10 carbon atoms, and a methoxy group, ethoxy group and propoxy group. X is selected from a single bond, alkyl groups having 1 to 10 carbon atoms, an ether group, ester group, ketone group, sulfone group and amide group.

In the present invention, it is preferable that the temperature atmosphere is 200° C. or more and is not more than the thermal decomposition temperature of an organic resin used.

In the present invention, the time of curing a substrate is preferably from 1 minute to 5 hours, further preferably from 15 minutes to 1 hour.

Further, the present invention relates to a method for producing an organic insulating film comprising coating on a substrate a solution containing a dissolved organic resin having a structure of the formula (1), then, curing the above-mentioned substrate under a temperature atmosphere of 200° C. or more and ① under an inert gas atmosphere of an oxygen concentration of 1 vol % or less, and/or, ② under a pressure-reduced air atmosphere of 0.05 atm or less. It is preferable that, in the formula (1), at least one of $R^1$ to $R^8$ is a functional group containing a double bond having 2 to 10 carbon atoms or a functional group containing a triple bond having 2 to 10 carbon atoms.

In the present invention, it is preferable that the temperature atmosphere is 200° C. or more and is not more than the thermal decomposition temperature of an organic resin used.

In the present invention, the time of curing a substrate is preferably from 1 minute to 5 hours, further preferably from 15 minutes to 1 hour.

Further, in the present invention, the above-mentioned substrate is preferably exposed ① under an inert gas atmosphere of an oxygen concentration of 1 vol % or less, and/or, ② under a pressure-reduced air atmosphere of 0.005 atm or less.

The atmosphere ① and the atmosphere maybe applied alone or in combination. Further, a substrate may be exposed under the atmosphere ①, then, exposed under the atmosphere ②, under a temperature atmosphere of 200° C. or more, alternatively, a substrate may be cured under the atmosphere ②, then, exposed under the atmosphere ①, under a temperature atmosphere of 200° C. or more.

The condition ② that under a pressure-reduced air atmosphere of 0.05 atm or less is excellent for a method of forming stably an organic insulating film. For the purpose of improving throughput, the condition ① that under an inert gas atmosphere of an oxygen concentration of 1 vol % or less is preferable.

As the method for attaining the above-mentioned atmosphere ①, an inert gas film-separating method, and a method using a reducing agent are listed. By these methods, the oxygen concentration can be controlled. The oxygen concentration can be measured by a method in which an industrially used oxygen detector is connected to a gas line used, or a method in which an atmosphere gas is sampled by any method and analyzed by gas chromatography.

In the present invention, as the method for exposing a substrate under an atmosphere of 200° C. or more, a substrate may advantageously be cured for example under an atmosphere heated to 200° C. or more, and this method is not particularly restricted. As the method for producing such an atmosphere, a heating method using a hot plate which is used generally for electronic devices, a heating method using a furnace, and a heating method using irradiation of light such as RTP and the like, are listed. As the heating method used in the present invention, the method using a furnace is preferable particularly since the apparatus is simple and temperature control is easy.

As the inert gas used in the present invention, for example, nitrogen, helium, neon, argon, krypton, xenon and the like are listed, and industrially cheap nitrogen is preferable.

In forming an organic insulating film, particularly the atmosphere is not restricted in the heating treatment of a substrate in the pre-step at less than 200° C. Specifically, a substrate may be pre-baked under an atmosphere of less than 200° C. under the condition of exposure of the substrate to air.

By a method for producing an organic insulating film of the present invention, an organic insulating film having low dielectric constant can be stably formed on a substrate.

According to the present invention, an organic insulating film having low dielectric constant can be stably obtained.

EXAMPLE

The following examples illustrate the present invention further in detail, but do not limit the scope of the present invention.

Synthesis Example 1

Into a 500 ml four-necked flask was charged 21.6 g (0.05 mol) of 1,1-Bis(4-hydroxy-3-cyclohexylphenyl) cyclohexylidene, 4.0 g of sodium hydroxide, 70.0 g of benzophenone and 50.0 g of toluene, and dehydrated under reflux. After completion of the dehydration, 15.6 g (0.05 mol) of dibromobiphenyl was added. Further, a solution obtained by dissolving 0.05 g of cuprous chloride in 5 g of pyridine was added, and reacted at an internal temperature of 185° C. for 6 hours. After cooled to room temperature, the reaction solution was added to a solution obtained by mixing 600 g of methanol with 10 g of acetic acid, to precipitate a product. The precipitated product was filtrated, and washed with a large amount of methanol to obtain a polymer substance, and further dried under reduced pressure at 60° C. for 8 hours. This is called Resin A.

To 4.0 g of Resin A herein obtained was added 100 ml of tetrahydrofuran, to dissolve the resin. Further, 21.5 ml of n-butyllithium (1.6 M n-hexane solution) was added, and stirred for 1 hour under nitrogen flow, then, 4.0 g of allyl bromide was added to this, and the mixture was further stirred for about 1 hour. After completion of the reaction, the reaction solution was charged into a mixed solvent of 650 g of methanol and 20 g of acetic acid, to precipitate a polymer substance which was filtrated, then, washed with methanol and water sequentially, then, dried under reduced pressure at 60° C. for 8 hours to obtain a product in the form of a white powder. This is called Resin B. As a result of thermogravimetric analysis (DTA-50 type manufactured by Shimadzu Corp.) under nitrogen atmosphere, the thermal decomposition initiation temperature was about 425° C.

Synthesis Example 2

To 10.0 g of the above-mentioned Resin A was added 200 ml of tetrahydrofuran, to dissolve the resin. Further, 110 ml of n-butyllithium (1.6 M n-hexane solution) was added, and stirred for 1 hour under nitrogen flow, then, 12 g of dimethylvinylsilyl chloride was added to this, and the mixture was further stirred for about 1 hour. After completion of the reaction, the reaction solution was charged into a mixed solvent of 800 g of methanol and 20 g of acetic acid, to precipitate a polymer substance which was filtrated, then, washed with methanol and water sequentially, then, dried under reduced pressure at 60° C. for 8 hours to obtain a product in the form of a white powder. This is called Resin C. As a result of thermogravimetric analysis (DTA-50 type manufactured by Shimadzu Corp.) under nitrogen atmosphere, the thermal decomposition initiation temperature was about 450° C.

EXAMPLES 1 to 10

Resins B, C obtained in Synthesis Examples 1, 2 were dissolved in anisole to give solid content of 15%, and filtrated through a 0.2 μm filter to prepare a resin solution.

Then, the resin solution was spin-coated on a 4-inch silicon wafer at a revolution of 2000 rpm, and baked for 1 minute at 150° C., then, heat-treated for 30 minutes under conditions of Table 1 (Oxygen concentration indicates vol % in an atmosphere gas, nitrogen. Pressure is 1 atm.). Film thickness uniformity was measured by an optical film thickness meter (manufactured by Nanometric, Nanospec 210), and as a result of measurement at inplane 15 points or more, variation coefficient was checked. The relative dielectric constant was measured according to a mercury probe method measuring C–V (SSM495 type, manufactured by SSS) at a motion frequency of 1 MHz.

TABLE 1

| Example | 1 | 2 | 3 | 4 | 5 |
|---|---|---|---|---|---|
| Resin solution | B | B | B | B | B |
| Oxygen concentration (vol %) | 0.5 | 0.5 | 0.01 | 0.001 | 0.001 |
| Treatment temperature (° C.) | 300 | 350 | 350 | 300 | 350 |
| Film thickness variation coefficient (%) | ≦1 | ≦1 | ≦1 | ≦1 | ≦1 |
| Relative dielectric constant | 2.84 | 2.88 | 2.82 | 2.70 | 2.76 |
| Inplane pinhole number | None | Two | None | None | None |

TABLE 2

| Example | 6 | 7 | 8 | 9 | 10 |
|---|---|---|---|---|---|
| Resin solution | C | C | C | C | C |
| Oxygen concentration (vol %) | 0.5 | 0.5 | 0.001 | 0.001 | 0.001 |
| Treatment temperature (° C.) | 300 | 350 | 300 | 350 | 400 |
| Film thickness variation coefficient (%) | ≦1 | ≦1 | ≦1 | ≦1 | ≦1 |
| Relative dielectric constant | 2.70 | 2.84 | 2.57 | 2.57 | 2.60 |
| Inplane pinhole number | None | None | None | None | One |

COMPARATIVE EXAMPLES 1 to 2

The same operation as in Example 2 was conducted except that the heat treatment at 350° C. was conducted in air. The results are shown in Table 3.

TABLE 3

| Comparative example | 1 | 2 |
|---|---|---|
| Resin solution | B | C |
| Oxygen concentration (vol %) | 21 | 21 |
| Treatment temperature (° C.) | 350 | 350 |
| Relative dielectric constant | Immeasurable | Immeasurable |
| Inplane pinhole number | Fifty or more | Fifty or more |

What is claimed is:

1. A method for producing an organic insulating film comprising the steps of coating a solution containing a dissolved organic resin having a structure of the following formula (1) on a substrate, and exposing said coated substrate at a temperature of 200° C. or more under an atmosphere of an oxygen partial pressure of 0.01 atm or less,

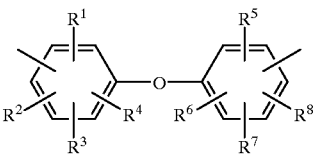

(1)

wherein, each of $R^1$ to $R^8$ is independently selected from the group consisting of a hydrogen atom, fluorine atom, chlorine atom, bromine atom and iodine atom, alkyl groups having 1 to 10 carbon atoms, functional groups containing a double bond having 2 to 10 carbon atoms, functional groups containing a triple bond having 2 to 10 carbon atoms, a methoxy group, ethoxy group and propoxy group.

2. A method for producing an organic insulating film comprising the steps of coating a solution containing a dissolved organic resin having a structure of the formula (1) according to claim 1 on a substrate, and exposing said coated substrate at a temperature of 200° C. or more and at least one condition selected from the group consisting of under an inert gas atmosphere of an oxygen concentration of 1 vol % or less and under a pressure-reduced air atmosphere of 0.05 atm or less.

3. The method according to claim 1, wherein at least one of $R^1$ to $R^8$ in the formula (1) in claim 1 is a functional group containing a double bond having 2 to 10 carbon atoms or a functional group containing a triple bond having 2 to 10 carbon atoms.

4. The method according to claim 1, wherein the substrate is exposed in a furnace.

5. The method according to claim 2, wherein the inert gas is nitrogen.

6. The method according to claim 2, wherein at least one of $R^1$ to $R^8$ in the formula (1) in claim 1 is a functional group containing a double bond having 2 to 10 carbon atoms or a functional group containing a triple bond having 2 to 10 carbon atoms.

7. The method according to claim 2, wherein the substrate is exposed in a furnace.

* * * * *